United States Patent
Lee et al.

(10) Patent No.: US 7,863,755 B2
(45) Date of Patent: Jan. 4, 2011

(54) PACKAGE-ON-PACKAGE SYSTEM WITH VIA Z-INTERCONNECTIONS

(75) Inventors: Taewoo Lee, Icheon-Si (KR); Sang-Ho Lee, Yeoju (KR); SeungYun Ahn, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 325 days.

(21) Appl. No.: 12/051,625

(22) Filed: Mar. 19, 2008

(65) Prior Publication Data
US 2009/0236752 A1 Sep. 24, 2009

(51) Int. Cl.
*H01L 23/48* (2006.01)
(52) U.S. Cl. .................. 257/777; 257/686; 257/787; 257/E23.116; 257/E23.169; 438/109
(58) Field of Classification Search .................. 257/686, 257/777, 787, E23.116, E23.169; 438/109
See application file for complete search history.

(56) References Cited

U.S. PATENT DOCUMENTS

| | | | |
|---|---|---|---|
| 6,297,548 B1 * | 10/2001 | Moden et al. | 257/686 |
| 6,501,165 B1 * | 12/2002 | Farnworth et al. | 257/686 |
| 6,650,007 B2 * | 11/2003 | Moden et al. | 257/686 |
| 7,185,426 B1 | 3/2007 | Hiner et al. | |
| 7,656,017 B2 * | 2/2010 | Kim et al. | 257/686 |
| 7,656,031 B2 * | 2/2010 | Chen et al. | 257/733 |
| 2004/0070083 A1 * | 4/2004 | Su | 257/778 |
| 2006/0244157 A1 | 11/2006 | Carson | |
| 2007/0181989 A1 | 8/2007 | Corisis et al. | |
| 2007/0278696 A1 | 12/2007 | Lu et al. | |
| 2009/0039523 A1 * | 2/2009 | Jiang et al. | 257/777 |
| 2009/0140408 A1 * | 6/2009 | Lee et al. | 257/686 |

OTHER PUBLICATIONS

Bart Swinnen and Eric Beyne, 3-D-stacked ICs with Copper Nails, http://ap.pennnet.com/Articles/Article_Display.cfm?Section=ARTCL&ARTICLE_ID=247016&VERSION_NUM=2&p=36, Advanced Packaging, Feb. 2006.

* cited by examiner

*Primary Examiner*—Andy Huynh
(74) *Attorney, Agent, or Firm*—Mikio Ishimaru

(57) ABSTRACT

A package-on-package system includes: providing an interposer substrate; mounting a base substrate under the interposer substrate and having a first integrated circuit die connected thereto; forming an encapsulant between the interposer substrate and the base substrate, the encapsulant encapsulating the first integrated circuit die; and forming a via z-interconnection extending through the encapsulant and one of the substrates to the other of the substrates.

17 Claims, 4 Drawing Sheets

PACKAGE-ON-PACKAGE SYSTEM WITH VIA Z-INTERCONNECTIONS

TECHNICAL FIELD

The present invention relates generally to integrated circuit package systems, and more particularly to a package-on-package system.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used.

A Package-on-Package (PoP), as its name implies, is a semiconductor packaging innovation that involves the stacking of two or more packages on top of one another. The PoP is a three dimensional (3D) package in which a fully tested package, such as single die Ball-Grid-Array or stacked die Ball-Grid-Array (typically memory die) is stacked on a bottom PoP package which usually contains a logic device or logic device combination (logic plus logic, logic plus analog, etc.).

The Fan-in Package-on-Package (Fi-PoP) package system is a stacked package system that allows stacking multiple logic, analog, and memory packages in the bottom PoP package. The Fi-PoP package system structure allows for smaller conventional memory packages to be mounted with center ball grid array patterns on the top PoP package.

The Fi-PoP package system also accommodates larger die sizes in a reduced footprint as compared to conventional PoP designs. The footprint reflects what is typically the maximum dimension of the package, namely, the x-y dimension of the package in the horizontal plane.

The bottom Fi-PoP (Fi-PoPb) provides the flexibility to package a single device or multiple devices (logic, analog or memory), while providing land pads on the top center of the package to allow for another package or components to be reflowed on top. The Fi-PoPb can also incorporate a fully tested Internal Stacking Module (ISM) package.

In addition, the Fi-PoPb can be smaller than current standard bottom PoP as interconnection is done by means of wire bonds, not solder balls at the edge of the bottom PoP. The package mounted on top of the Fi-PoPb can be a center Ball-Grid-Array package, such as a typical stacked die memory package or multiple packages or components. The top package can be significantly smaller than the current standard top PoP since it is no longer coupled to bottom package by peripheral solder ball connections. The result is a flexible 3D stacked package solution with smaller footprint, less board mount issues (warpage) and lower overall cost.

The Fi-PoP package system is meant to deliver increased functional integration in a smaller form factor, flexibility in stacking conventional memory packages on top, improved final assembly yields, and a lower overall cost compared with conventional PoP solutions. The bottom and top package footprint can be reduced significantly (up to 25% and 65% respectively), thus taking up less board space and decreasing the overall cost of this PoP solution.

One of the problems with the Fi-PoP package system is due to bond wires being required between the top package and the bottom package of the Fi-PoP package system. A mold encapsulant is required to cover and protect the bond wires that leaves only an encapsulant cavity in the center of the top package in which external top packages can be mounted. Thus, the encapsulant cavity limits the size of the packages that can be stacked to the top of the Fi-PoP package.

Another problem is that the encapsulant used for covering the bond wires results in a tall Fi-PoP package.

In view of the ever-increasing commercial competitive pressures, along with growing consumer expectations to produce smaller, more reliable integrated circuit package, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a package-on-package system including: providing an interposer substrate; mounting a base substrate under the interposer substrate and having a first integrated circuit die connected thereto; forming an encapsulant between the interposer substrate and the base substrate, the encapsulant encapsulating the first integrated circuit die; and forming a via z-interconnection extending through the encapsulant and one of the substrates to the other of the substrates.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
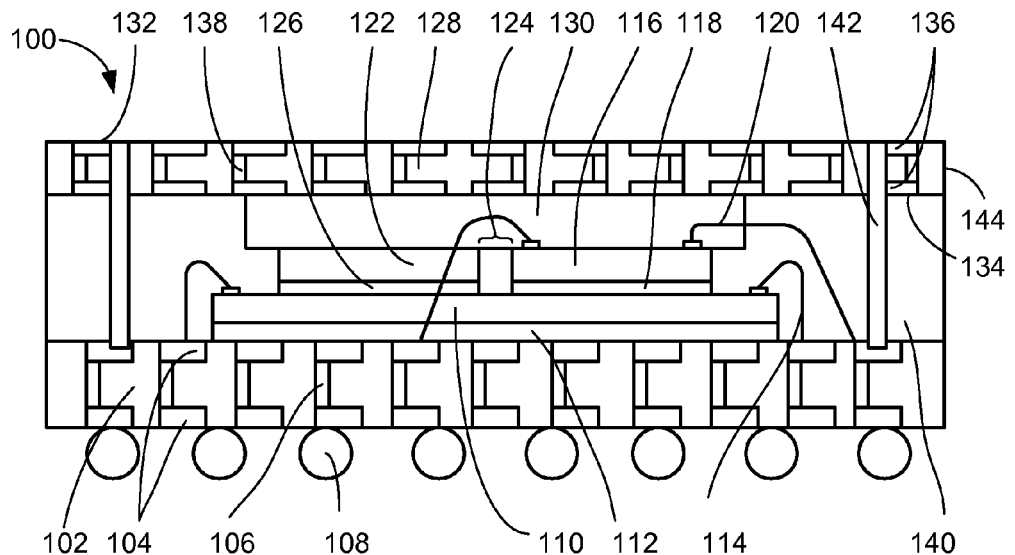
FIG. 1 is a cross-sectional view of a package-on-package system with via z-interconnections in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIG. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit package, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "inside" as used herein is defined as in the interior of a cavity.

The term "system" as used herein refers to and is defined as the method and as the apparatus of the present invention in accordance with the context in which the term is used.

Referring now to FIG. 1, therein is shown a cross-sectional view of a package-on-package system 100 with via z-interconnections in an embodiment of the present invention. The package-on-package system 100 includes a base substrate 102, having base contact pads 104 and base vias 106, such as metallic vias. In some embodiments, the base contact pads 104 are connected by wire traces (not shown).

The base substrate 102 can be made of many materials, such as laminate substrate, ceramic, metal leadframe, or other materials. The base substrate 102 includes external electrical connectors 108, such as solder balls, for external connections to a next level system, such as another package or a printed circuit board (not shown).

On top of the base substrate 102 is attached a first integrated circuit die 110 using a first attachment material 112, such as a thermally conductive adhesive.

The first integrated circuit die 110 is electrically coupled to the base contact pads 104 of the base substrate 102 using first base electrical connectors 114, such as bond wires.

A second integrated circuit die 116 is attached to the first integrated circuit die 110 using a second attachment material 118, such as a thermally conductive adhesive. The second integrated circuit die 116 is electrically coupled to the base contact pads 104 of the base substrate 102 using second base electrical connectors 120, such as bond wires.

Since the second integrated circuit die 116 can be of smaller footprint (x-y dimension of the package in the horizontal plane) than the first integrated circuit die 110, a third integrated circuit die 122 may be attached over the first integrated circuit die 110 next to the second integrated circuit die 116 leaving an interstice 124 between the second integrated circuit die 116 and the third integrated circuit die 122. The third integrated circuit die 122 is attached to the first integrated circuit die 110 using a third attachment material 126, such as a thermally conductive adhesive.

For illustrative purposes, a stack of two integrated circuit dies are shown although it is understood that any number of integrated circuit dies may be used. The second integrated circuit die 116 or the third integrated circuit die 122 can be replaced by a spacer die or a dummy chip.

As a further option, the second integrated circuit die 116 may be of equivalent in size to the first integrated circuit die 110, eliminating the third integrated circuit die 122.

An interposer substrate 128 is attached above the second integrated circuit die 116 and the third integrated circuit die 122 using a lead-in-film adhesive 130.

The lead-in-film adhesive 130 has a low viscosity and, as temperature increases, the viscosity gets lower. Therefore, the lead-in-film adhesive 130 can be easily pressed over the second base electrical connectors 120 above the second integrated circuit die 116 and the third integrated circuit die 122 and then cured to harden the lead-in-film adhesive 130.

Typically the lead-in-film adhesive 130 is made of a B-stage material that can be hardened after curing and can maintain a predetermined thickness.

It has been discovered that the lead-in-film adhesive 130 should be at least 20 μm (microns) over the loop height of the second base electrical connectors 120.

The interposer substrate 128 can be the same as the base substrate 102 or it can be made of many different materials, such as laminate substrate, ceramic, metal leadframe, or other materials. In the embodiment shown, it is a thinner version of the base substrate 102.

Instead of the interposer substrate 128, another option is to use an internal stacking module interposer. An internal stacking module interposer is an integrated circuit package that can have bond pads for pre-testing and can receive another Ball-Grid-Array package on top.

The interposer substrate 128 includes a mounting surface 132 and an attachment surface 134. The attachment surface 134 is attached to the second integrated circuit die 116 and the third integrated circuit die 122 using the lead-in-film adhesive 130. The interposer substrate 128 has interposer contact pads 136, such as land pads, and interposer vias 138, such as metallic vias.

The interposer contact pads 136 may be used to electrically connect other packages, such as a top integrated circuit package (not shown). In some embodiments, the interposer contact pads 136 are connected by wire traces (not shown).

An encapsulant 140 is formed between the interposer substrate 128 and the base substrate 102, and encapsulates the first integrated circuit die 110, the second integrated circuit die 116, and the third integrated circuit die 122 filling the interstice 124. The first base electrical connectors 114 are fully embedded in the encapsulant 140 and the second base electrical connectors 120 are partially embedded in the encapsulant 140.

Via z-interconnections 142 provide a connection from the mounting surface 132, through the interposer substrate 128, and through the encapsulant 140 down to the base contact pads 104 on the top of the base substrate 102. The term "via z-interconnection" as used herein refers to a connection that extends vertically in an x-y-z coordinate system.

While the via z-interconnections 142 are through the interposer substrate 128 to the base substrate 102 because the interposer substrate 128 is thinner than the base substrate 102, the z-interconnections could equally well be through the base substrate 102 to the interposer substrate 128.

Since the electrical signal of the package-on-package system 100 is transmitted from the printed circuit board (not shown) to the first integrated circuit die 110 via the base substrate 102, and to a top integrated circuit package (not shown) attached above the interposer substrate 128, the electrical signal is moving in an "inward" direction; thus, this system could be called a Fan-in package-on-package system.

Even though with the Fan-in package-on-package system the footprint of the bottom and top packages can be reduced significantly (up to 25% and 65%, respectively), thus taking up less horizontal space, the height of the Fan-in package-on-package system still needs to be decreased.

It has been discovered that using the via z-interconnections 142 for electrically interconnecting the base substrate 102 to the interposer substrate 128 of the package-on-package system 100, the height (dimension in the z-direction) of the package-on-package system 100 can be reduced greatly since the partial encapsulation used with wire bonding is eliminated when using the via z-interconnections 142.

It has also been discovered that the via z-interconnections 142 allow finer pitch and higher interconnection density since the mounting surface 132 of the interposer substrate 128 is fully exposed to allow mounting of the top packages (not shown).

It has also been discovered that the package-on-package system 100 with the via z-interconnections 142 may be formed with finer pitch than the pitch available with other forms of interconnections, such as the wire bond interconnection, by increasing the electrical connectivity between the interposer substrate 128 and the base substrate 102.

It has also been discovered that the interposer substrate 128 provides a flexible interface for compatibility to several different or multiple package connections, such as direct die attach, chip on board, flip chip, area array packages, leaded packages, or leadless packages.

It has also been discovered that, for stacked packages, using the via z-interconnections 142 allows a higher input/output count than perimeter interconnections, such as wire bond interconnection. The via z-interconnections 142 have shorter interconnection distances between the stacked packages, with lower electrical parasitic losses, supporting higher-frequency operation.

It has also been discovered that the package-on-package system 100 provides stacking of packages or integrated circuit dies. Multiple packages or integrated circuit dies/chips may be stacked one over the other rather in the same planar surface. The stacking increases the typically smaller height dimension rather than increasing the typically larger planar dimension resulting in size and performance improvements.

It has also been discovered that the two substrates, such as the base substrate 102 and the interposer substrate 128, together with the encapsulant 140 allow manufacturing the packages in mass production using the two substrates, such as the base substrate 102 and the interposer substrate 128 in strip form.

Figure 2:
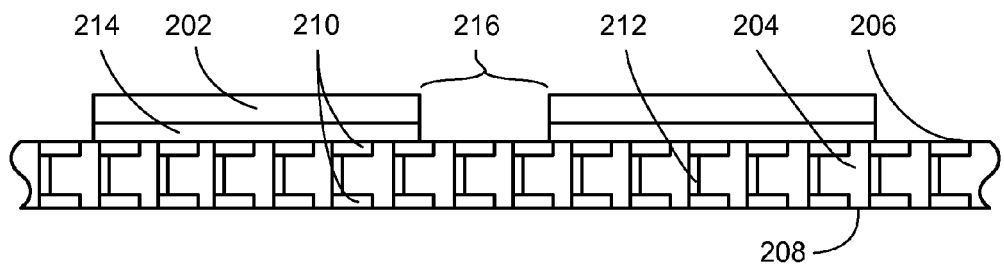
FIG. 2 is the structure of FIG. 1 in an intermediate mounting step of strip level manufacture.

Referring now to FIG. 2, therein is shown the structure of FIG. 1 in an intermediate mounting step of strip level manufacture. First integrated circuit dies 202 are attached to a strip base substrate 204.

The strip base substrate 204 has a top surface 206 and a bottom surface 208. The strip base substrate 204 has strip base contact pads 210, such as land pads, on the top surface 206 and the bottom surface 208 to provide for further electrical connections. The strip base substrate 204 also has strip base vias 212, such as metallic vias, to transmit electrical signals between the top surface 206 and the bottom surface 208 of the strip base substrate 204.

The first integrated circuit dies 202 are attached to the strip base substrate 204 using a first attachment material 214, such as a thermally conductive adhesive. The first integrated circuit dies 202 are placed on the strip base substrate 204 such that a space 216 is kept between the first integrated circuit dies 202.

Figure 3:
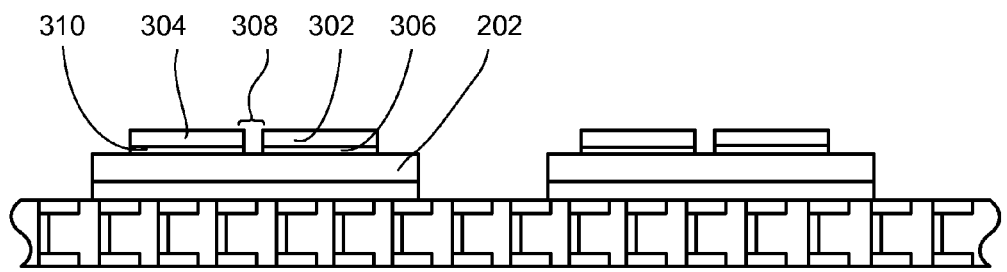
FIG. 3 is the structure of FIG. 2 in a die attach step of strip level manufacture.

Referring now to FIG. 3, therein is shown the structure of FIG. 2 in a die attach step of strip level manufacture.

Second integrated circuit dies 302 and third integrated circuit dies 304 with interstices 308 therebetween are attached to the first integrated circuit dies 202 using a second attachment material 306 and a third attachment material 310, such as thermally conductive adhesives.

The third integrated circuit dies 304 are attached over the first integrated circuit dies 202 in order to create support for other packages to be mounted over the second integrated circuit dies 302 since the second integrated circuit dies 302 can have smaller footprint than the first integrated circuit dies 202. In the present embodiment, the third integrated circuit dies are dummy dies.

Figure 4:
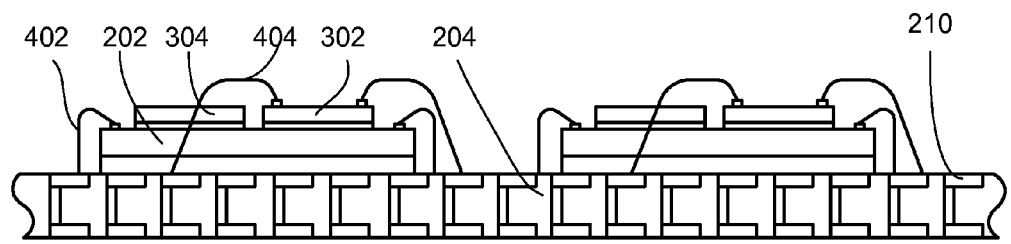
FIG. 4 is the structure of FIG. 3 in a wire bonding step of strip level manufacture.

Referring now to FIG. 4, therein is shown the structure of FIG. 3 in a wire bonding step of strip level manufacture. The first integrated circuit dies 202 are electrically coupled to the strip base contact pads 210 of the strip base substrate 204 using first strip base electrical connectors 402, such as bond wires.

The second integrated circuit dies 302 are electrically coupled to the strip base contact pads 210 of the strip base substrate 204 using second strip base electrical connectors 404, such as bond wires.

The third integrated circuit dies 304 are dummy dies and are not wire bonded to the strip base substrate 204.

Figure 5:
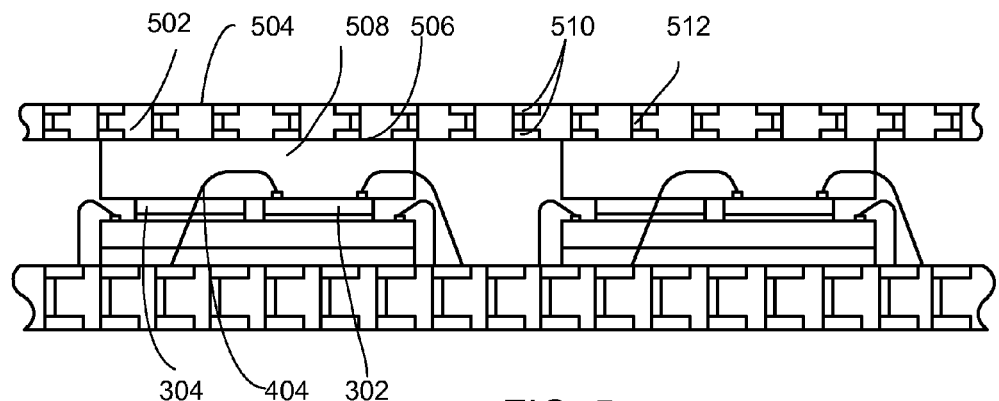
FIG. 5 is the structure of FIG. 4 in a substrate attachment step of strip level manufacture.

Referring now to FIG. 5, therein is shown the structure of FIG. 4 in a substrate attachment step of strip level manufacture.

A strip interposer substrate 502 having a mounting surface 504 and an attachment surface 506 is attached over the second integrated circuit dies 302 and the third integrated circuit dies 304 using a lead-in-film adhesive 508.

The lead-in-film adhesive 508 has a low viscosity and, as temperature increases, the viscosity gets lower. Therefore, the lead-in-film adhesive 508 can be easily pressed over the second base electrical connectors 404 above the second integrated circuit die 302 and the third integrated circuit die 304 and then cured to harden the lead-in-film adhesive 508.

The strip interposer substrate 502 has strip interposer contact pads 510, such as land pads, on the mounting surface 504 and the attachment surface 506 to provide electrical contacts for external attachments. The strip interposer substrate 502 also has strip interposer vias 512, such as metallic vias, to transmit electrical signals between the mounting surface 504 and the attachment surface 506 of the strip interposer substrate 502.

The strip interposer substrate 502 is the same as the strip base substrate 204 or it can be can be made of many different materials, such as laminate substrate, ceramic, metal leadframe, or other materials. In the embodiment shown, it is a thinner version of the strip base substrate 204.

Figure 6:
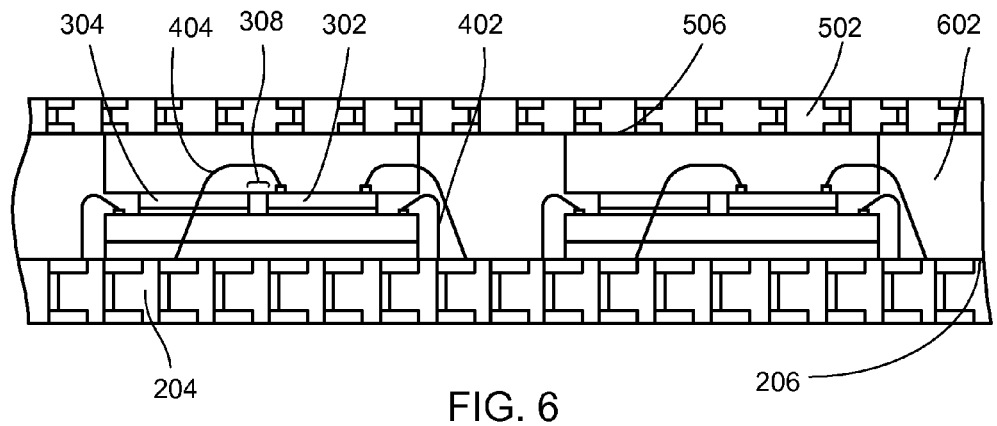
FIG. 6 is the structure of FIG. 5 in an encapsulant molding step of strip level manufacture.

Referring now to FIG. 6, therein is shown the structure of FIG. 5 in an encapsulant molding step of strip level manufacture.

A strip encapsulant 602 is formed between the strip base substrate 204 and the strip interposer substrate 502, and encapsulates the first integrated circuit dies 202, the second integrated circuit dies 302, and the third integrated circuit dies 304 filling the interstices 308. The first base electrical connectors 402 are fully embedded in the strip encapsulant 602 and the second base electrical connectors 404 are partially embedded in the strip encapsulant 602.

Figure 7:
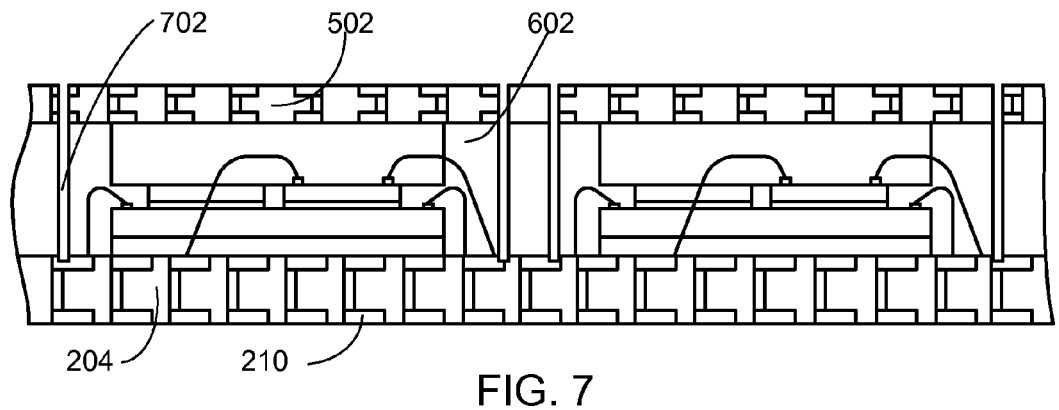
FIG. 7 is the structure of FIG. 6 in a via hole forming step of strip level manufacture.

Referring now to FIG. 7, therein is shown the structure of FIG. 6 in a via hole forming step of strip level manufacture.

To be able to use the strip interposer substrate 502 for connection of integrated circuit packages on top or bottom surfaces, the strip base substrate 204 and the strip interposer substrate 502 needs to be electrically coupled. To create an electrical interconnection between the strip base substrate 204 and the strip interposer substrate 502, via holes 702 are first formed in the vertical, or z-direction.

The via holes 702, are drilled through the strip interposer substrate 502, and through the strip encapsulant 602 down to the strip base contact pads 210 on the top of the strip base substrate 204. The via holes 702 partially penetrate the strip base contact pads 210 to form a clean conductor surface that is free of dielectric residue and other contaminates.

The via holes 702 may be formed by a number of different methods including laser or mechanically drilling, mechanical punching, plasma ablation, photo defined via technologies, etc.

While a single peripheral row of the via holes 702 is shown, it is possible to drill multiple peripheral rows of the via holes 702.

Figure 8:
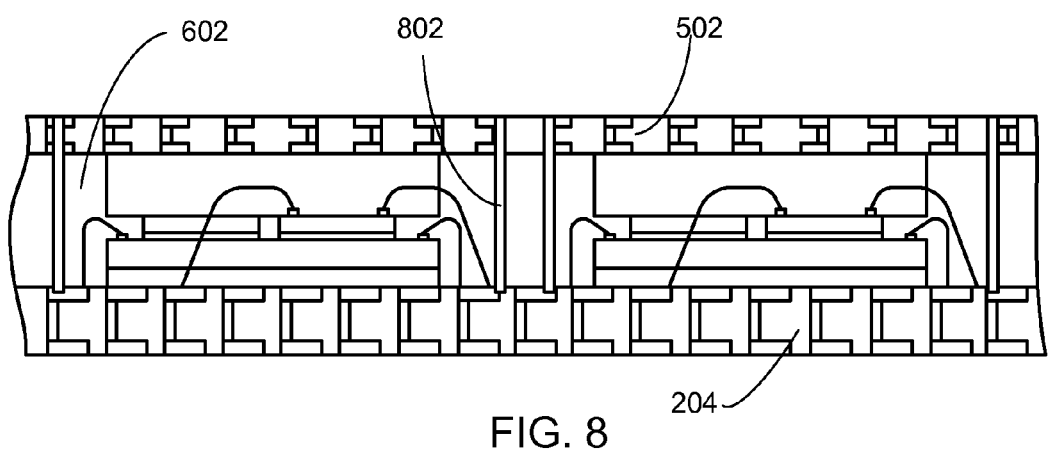
FIG. 8 the structure of FIG. 7 in a via z-interconnection forming step of strip level manufacture.

Referring now to FIG. 8, therein is shown the structure of FIG. 7 in a via z-interconnection forming step of strip level manufacture.

To establish an electrical interconnection between the strip base substrate 204 and the strip interposer substrate 502, the via hole formation step of FIG. 7 is followed by filling the via holes 702 with an electrically conductive material.

In the via z-interconnection forming step of manufacture, a conductive material is deposited inside the via holes 702 thereby forming via z-interconnections 802 between the strip base substrate 204 and the strip interposer substrate 502.

The conductive material used to form the via z-interconnections 802 may be electroplated or electro-less plated metal, conductive paste such as copper or silver epoxy compounds, or a low melting temperature high-wicking solder alloy.

Figure 9:
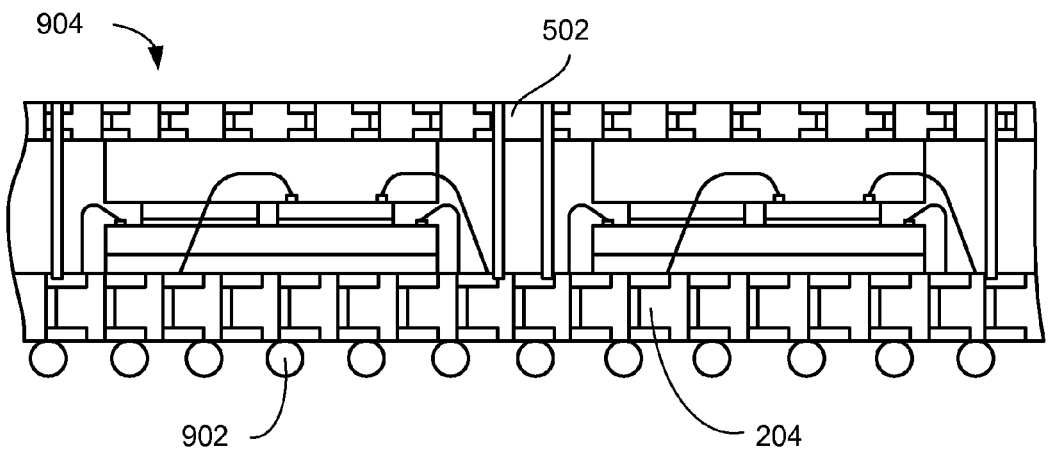
FIG. 9 is the structure of FIG. 8 in a solder ball mount step of strip level manufacture.

Referring now to FIG. 9, therein is shown the structure of FIG. 8 in a solder ball mount step of strip level manufacture.

In the solder ball mount step of manufacture, external electrical connectors 902, such as solder balls, are mounted on the bottom of the strip base substrate 204. The external electrical connectors 902 are used for external connections to a next level system, such as another package or a printed circuit board (not shown).

After mounting the external electrical connectors 902 to the bottom of the strip base substrate 204, a strip package-on-package system 904 is formed.

Figure 10:
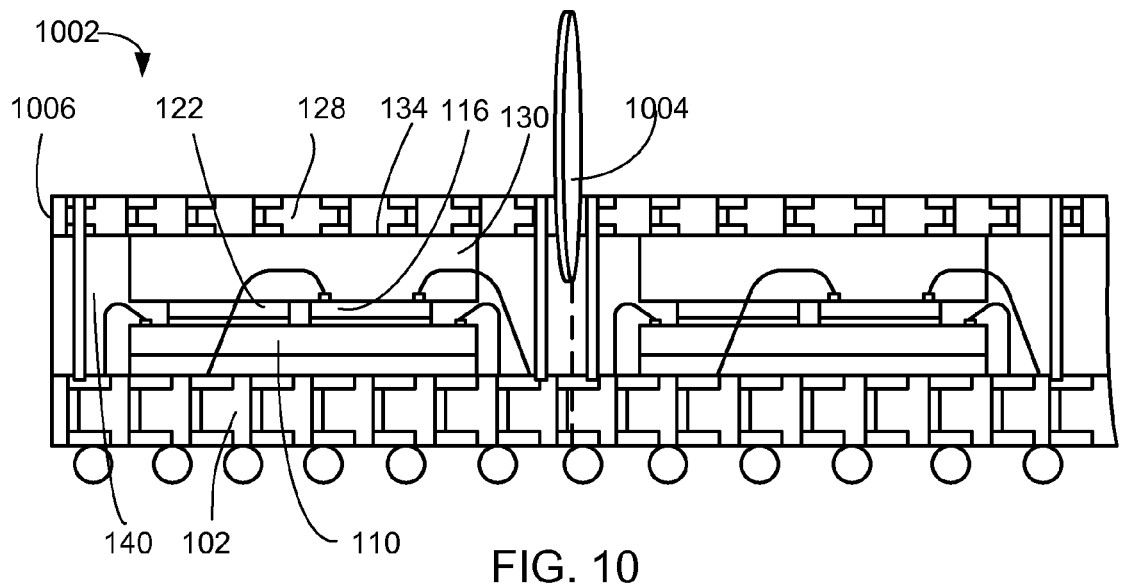
FIG. 10 is the structure of FIG. 9 in a singulation step of strip level manufacture.

Referring now to FIG. 10, therein is shown the structure of FIG. 9 in a singulation step of strip level manufacture.

After the strip package-on-package system 904 is formed, a singulation process is used to create a unit package-on-package system 1002. The singulation process is performed using a cutting device, such as a saw blade 1004 or laser.

The unit package-on-package system 1002 includes the base substrate 102, the interposer substrate 128, the first integrated circuit die 110, the second integrated circuit die 116, the third integrated circuit die 122, the lead-in-film adhesive 130, and the encapsulant 140.

The encapsulant 140 fills the space between the base substrate 102 and the attachment surface 134 of the interposer substrate 128 leaving sides 1006 of the interposer substrate 128 fully exposed.

Figure 11:
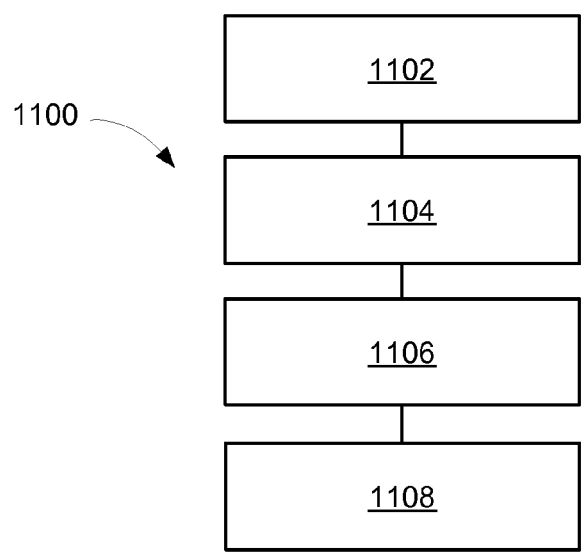
FIG. 11 is a flow chart of a package-on-package system for manufacturing the package-on-package system in an embodiment of the present invention.

Referring now to FIG. 11, therein is shown a flow chart of a package-on-package system 1100 for manufacturing the package-on-package system 1100 in an embodiment of the present invention.

The package-on-package system 1100 includes: providing an interposer substrate in a block 1102; mounting a base substrate under the interposer substrate and having a first integrated circuit die connected thereto in a block 1104; forming an encapsulant between the interposer substrate and the base substrate, the encapsulant encapsulating the first integrated circuit die in a block 1106; and forming a via z-interconnection extending through the encapsulant and one of the substrates to the other of the substrates in a block 1108.

It has been discovered that the present invention thus has numerous aspects.

An aspect is that the present invention provides a mounting surface over the interposer substrate. The interposer substrate provides electrical pads and connections for mounting and connecting other devices.

Another aspect is that the interposer substrate is fully exposed and there is no restriction on the footprint of the package that can be mounted on it.

It has been discovered that the package-on-package structure provides stacking of packages or integrated circuit chips. Multiple packages or integrated circuit chips may be stacked one over the other rather than the attachment on the same planar or largely the same planar surface. The stacking increases the typically smaller height dimension rather than increasing the typically larger planar dimension resulting in size and performance improvements.

It has been discovered that the package-on-package system provides a reduced footprint or planar dimension of the stacked integrated circuit package system. The stacking of integrated circuits allows multiple functions to fit into a smaller footprint than even some of the discrete devices placed individually on a substrate or other connection surface. The footprint area of the base substrate provides significantly smaller area requirement.

Yet another discovery of the disclosed structure is that many types of integrated circuits, such as passive devices, integrated circuits, integrated circuits with integrated passives, can be integrated. The interposer substrate provides a packaging system compatible with many and varied components including varied functions, dimensions, and connection configurations.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the package-on-package system of the present invention furnishes important and heretofore unknown and unavailable solutions, capabilities, and functional aspects for improving yield, increasing reliability, and reducing cost of the package-on-package system.

The resulting processes and configurations are straightforward, cost-effective, uncomplicated, highly versatile and effective, can be implemented by adapting known technologies, and are thus readily suited for efficiently and economically manufacture package-on-package systems fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A package-on-package system comprising:
   providing an interposer substrate;
   mounting a base substrate under the interposer substrate and having a first integrated circuit die connected thereto;
   mounting a second integrated circuit die on the first integrated circuit die and having electrical connectors to the base substrate;
   forming a lead-in-film adhesive on the interposer substrate and bonding the interposer substrate and the second integrated circuit die with the electrical connectors in the lead-in-film adhesive;
   forming an encapsulant between the interposer substrate and the base substrate, the encapsulant encapsulating the first integrated circuit die; and
   forming a via z-interconnection extending through the encapsulant and one of the substrates to the other of the substrates.

2. The system as claimed in claim 1 further comprising:
   mounting a third integrated circuit die on the first integrated circuit die; and
   forming a lead-in-film adhesive on the interposer substrate and bonding the interposer substrate and the third integrated circuit die by the lead-in-film adhesive.

3. The system as claimed in claim 1 wherein forming the via z-interconnection includes:
   forming a contact pad on the interposer substrate;
   forming a contact pad on the base substrate; and
   forming a via hole through the contact pad on one of the substrates and the encapsulant to the contact pad on the other of the substrates.

4. The system as claimed in claim 1 wherein forming the via z-interconnection includes:
   forming a via hole through one of the substrates and the encapsulant to the other substrate; and
   filling the via hole with a conductive material.

5. A package-on-package system comprising:
   providing a strip interposer substrate;
   mounting a strip base substrate under the strip interposer substrate and having first integrated circuit dies connected thereto;
   mounting second integrated circuit dies on the first integrated circuit dies and having electrical connectors to the strip base substrate;
   forming lead-in-film adhesive on the strip intemoser substrate and bonding the strip interposer substrate and the second integrated circuit dies with the electrical connectors in the lead-in-film adhesive;
   forming a strip encapsulant between the strip interposer substrate and the strip base substrate, the strip encapsulant encapsulating the first integrated circuit dies; and
   forming via z-interconnections extending through the strip encapsulant and one of the strip substrates to the other of the strip substrates.

6. The system as claimed in claim 5 further comprising:
   mounting third integrated circuit dies on the first integrated circuit dies; and
   forming the lead-in-film adhesive on the strip interposer substrates and bonding the strip interposer substrates to the third integrated circuit dies by the lead-in-film adhesive.

7. The system as claimed in claim 5 wherein forming the via z-interconnections includes:
   forming contact pads on the strip interposer substrate;
   forming contact pads on the strip base substrate; and
   forming via holes through the contact pads on one of the strip substrates and the strip encapsulant to the contact pads on the other of the strip substrates.

8. The system as claimed in claim 5 wherein forming the via z-interconnection includes:
   forming via holes through one of the strip substrates and the strip encapsulant to the other of the strip substrates; and
   filling the via holes with conductive material.

9. A package-on-package system comprising:
   an interposer substrate;
   a first integrated circuit die;
   a base substrate under the interposer substrate and having the first integrated circuit die connected thereto;
   a second integrated circuit die on the first integrated circuit die and having electrical connectors to the base substrate;
   a lead-in-film adhesive on the interposer substrate and bonding the interposer substrate and the second integrated circuit die with the electrical connectors in the lead-in-film adhesive;
   an encapsulant between the interposer substrate and the base substrate, the encapsulant encapsulating the first integrated circuit die; and
   a via z-interconnection extending through the encapsulant and one of the substrates to the other of the substrates.

10. The system as claimed in claim 9 further comprising:
   a third integrated circuit die on the first integrated circuit die; and
   a lead-in-film adhesive on the interposer substrate and bonding the interposer substrate and the third integrated circuit die by the lead-in-film adhesive.

11. The system as claimed in claim 9 wherein the via z-interconnection includes:
- a contact pad on the interposer substrate;
- a contact pad on the base substrate; and
- a via hole through the contact pad on one of the substrates and the encapsulant to the contact pad on the other of the substrates.

12. The system as claimed in claim 9 wherein the via z-interconnection includes:
- a via hole through one of the substrates and the encapsulant to the other substrate; and
- the via hole filled with a conductive material.

13. The system as claimed in claim 9 wherein:
- the interposer substrate is a strip interposer substrate;
- the first integrated circuit die is one of a plurality of first integrated circuit dies;
- the base substrate is a strip base substrate under the strip interposer substrate and having the first integrated circuit dies connected thereto;
- the encapsulant is a strip encapsulant between the strip interposer substrate and the strip base substrate, the strip encapsulant encapsulating the first integrated circuit dies; and
- the via z-interconnections extends through the strip encapsulant and one of the strip substrates to the other of the strip substrates.

14. The system as claimed in claim 13 wherein:
- the second integrated circuit die is one of a plurality of second integrated circuit dies on the first integrated circuit dies and having electrical connectors to the strip base substrate; and
- the lead-in-film adhesive on the strip interposer substrate bonds the strip interposer substrate and the second integrated circuit dies with the electrical connectors in the lead-in-film adhesive.

15. The system as claimed in claim 13 further comprising:
- third integrated circuit dies on the first integrated circuit dies; and
- lead-in-film adhesive on the strip interposer substrates and bonding the strip interposer substrates to the third integrated circuit dies by the lead-in-film adhesive.

16. The system as claimed in claim 13 wherein the via z-interconnections includes:
- contact pads on the strip interposer substrate;
- contact pads on the strip base substrate; and
- via holes through the contact pads on one of the strip substrates and the strip encapsulant to the contact pads on the other of the strip substrates.

17. The system as claimed in claim 13 wherein the via z-interconnection includes:
- via holes through one of the strip substrates and the strip encapsulant to the other of the strip substrates; and
- the via holes filled with conductive material.

\* \* \* \* \*